United States Patent
Kim et al.

(10) Patent No.: US 11,050,096 B2
(45) Date of Patent: Jun. 29, 2021

(54) BATTERY PROTECTION CIRCUIT AND BATTERY PACK INCLUDING SAME

(71) Applicant: SAMSUNG SDI CO., LTD., Yongin-si (KR)

(72) Inventors: Youngjun Kim, Yongin-si (KR); Jong-Chan Han, Yongin-si (KR)

(73) Assignee: Samsung SDI Co., Ltd., Yongin-si (KR)

( * ) Notice: Subject to any disclaimer, the term of this patent is extended or adjusted under 35 U.S.C. 154(b) by 243 days.

(21) Appl. No.: 16/361,119

(22) Filed: Mar. 21, 2019

(65) Prior Publication Data

US 2019/0379089 A1     Dec. 12, 2019

(30) Foreign Application Priority Data

Jun. 8, 2018 (KR) .................. 10-2018-0066250

(51) Int. Cl.
*H01M 10/44* (2006.01)
*H01M 10/48* (2006.01)
(Continued)

(52) U.S. Cl.
CPC ........ *H01M 10/443* (2013.01); *G01R 31/382* (2019.01); *H01M 10/425* (2013.01);
(Continued)

(58) Field of Classification Search
CPC ............. H01M 10/443; H01M 10/441; H01M 10/486; H01M 10/425; H02H 7/18; H02H 5/042; H02J 7/0091; G01R 31/382
(Continued)

(56) References Cited

U.S. PATENT DOCUMENTS

| | | | | |
|---|---|---|---|---|
| 5,608,304 A | * | 3/1997 | Okumura | H02J 7/0029 320/134 |
| 5,963,019 A | * | 10/1999 | Cheon | H02H 7/18 320/150 |

(Continued)

FOREIGN PATENT DOCUMENTS

| | | |
|---|---|---|
| CN | 205489483 U | 8/2016 |
| EP | 3316384 A1 | 5/2018 |
| JP | WO2005-046017 A1 | 5/2005 |
| KR | 10-0807063 B1 | 2/2008 |

OTHER PUBLICATIONS

EPO Extended Search Report dated Oct. 14, 2019, for corresponding European Patent Application No. 19179191.2 (8 pages).

*Primary Examiner* — Sun J Lin
(74) *Attorney, Agent, or Firm* — Lewis Roca Rothgerber Christie LLP

(57) ABSTRACT

A battery protection circuit includes: a plurality of pack terminals configured to connect a battery module to an external device; a first fuse element located on a current path between the battery module and the plurality of pack terminals to block a current flow between the battery module and the plurality of pack terminals depending on a voltage applied to a control terminal thereof; a first integrated circuit configured to include a first input terminal and configured to control a voltage outputted to the control terminal of the first fuse element depending on a voltage applied to the first input terminal; and a plurality of thermistors connected in series between a positive electrode of the battery module and a first input terminal of the first integrated circuit and each thermistor of the plurality of thermistors having resistance that is varied depending on a temperature of a corresponding cell among a plurality of cells constituting the battery module.

18 Claims, 3 Drawing Sheets

(51) Int. Cl.
  *H02J 7/00*      (2006.01)
  *G01R 31/382*    (2019.01)
  *H01M 10/42*     (2006.01)
  *H02H 5/04*      (2006.01)
  *H02H 7/18*      (2006.01)

(52) U.S. Cl.
  CPC ....... *H01M 10/441* (2013.01); *H01M 10/486* (2013.01); *H02H 5/042* (2013.01); *H02H 7/18* (2013.01); *H02J 7/0091* (2013.01)

(58) Field of Classification Search
  USPC ..................................................... 320/134
  See application file for complete search history.

(56) References Cited

U.S. PATENT DOCUMENTS

| | | | | |
|---|---|---|---|---|
| 6,819,083 | B1* | 11/2004 | Patino et al. ......... | H02J 7/0091 320/134 |
| 7,391,185 | B2* | 6/2008 | Tsubaki et al. ..... | H02J 7/00309 320/150 |
| 7,952,330 | B2* | 5/2011 | Mori ....................... | H01M 2/34 320/150 |
| 8,174,811 | B2* | 5/2012 | Hasunuma et al. .. | H01M 2/348 361/106 |
| 10,256,511 | B2* | 4/2019 | Clemente et al. .......................... | H01M 10/4264 |
| 10,389,148 | B2* | 8/2019 | Kim .................... | H01M 10/425 |
| 2007/0210893 | A1 | 9/2007 | Hasunuma et al. | |
| 2007/0273328 | A1 | 11/2007 | Nam et al. | |
| 2015/0180098 | A1 | 6/2015 | Eckl et al. | |

* cited by examiner

BATTERY PROTECTION CIRCUIT AND BATTERY PACK INCLUDING SAME

CROSS-REFERENCE TO RELATED APPLICATION

This application claims priority to and benefit of Korean Patent Application No. 10-2018-0066250, filed on Jun. 8, 2018 in the Korean Intellectual Property Office, the entire content of which is incorporated herein by reference.

BACKGROUND

1. Field

Aspects of embodiments of the present invention relate to a battery protection circuit and a battery pack including the same.

2. Description of the Related Art

A rechargeable battery, or secondary cell, is one that may perform charging and discharging alternately and repeatedly. The rechargeable battery may convert chemical energy into electrical energy to discharge it, and, conversely, when electrical energy is charged to the discharged rechargeable battery, it may be stored again in the form of chemical energy.

The rechargeable battery may be applied to various portable electronic devices. For example, a laptop computer may be equipped with a battery pack of a multi-series structure in which a plurality of rechargeable batteries (herein referred to as "cells") connected in series with each other are combined with a charge and discharge circuit.

A thermal cut-off (TCO) may be installed in a battery pack of a multi-series structure in which square cells or polymer cells are coupled in series. The TCO is an element for securing the safety of each cell from the risk of overcharging or short-circuiting by cutting off a current according to the temperature.

Since the TCO is operated by temperature, it should be closely attached to the cell such that temperature of the cell can be easily detected. Accordingly, additional components, such as tape, a Ni-plate, etc., are required to mount the TCO on the battery pack, or additional processes, such as welding, cell adhesion, and tape processing, are required. In addition, when the cell temperature is not properly detected due to the TCO mounting defect, such a protection operation of the TCO may not be performed properly.

The above information disclosed in this Background section is only for enhancement of understanding of the background of the invention and, therefore, it may contain information that does not form the prior art that is already known in this country to a person of ordinary skill in the art.

SUMMARY

According to aspects of embodiments of the present invention, a battery protection circuit, and a battery pack including the same, that are capable of supporting a safety operation by detecting the temperature of each cell constituting a battery pack instead of using a TCO are provided.

According to one or more exemplary embodiments of the present invention, a battery protection circuit includes: a plurality of pack terminals configured to connect a battery module to an external device; a first fuse element located on a current path between the battery module and the pack terminals to block a current flow between the battery module and the pack terminals depending on a voltage applied to a control terminal thereof; a first integrated circuit configured to include a first input terminal and control a voltage outputted to the control terminal of the first fuse element depending on a voltage applied to the first input terminal; and a plurality of thermistors connected in series between a positive electrode of the battery module and a first input terminal of the first integrated circuit and having resistance that is varied depending on a temperature of a corresponding cell among cells constituting the battery module.

In the battery protection circuit, the thermistors may correspond to the cells, respectively, and each of the thermistors may be located adjacent to the corresponding cell of the cells.

In the battery protection circuit, each of the thermistors may be a positive temperature coefficient thermistor.

In the battery protection circuit, each of the thermistors may include a chip mounted on a printed circuit board.

In the battery protection circuit, the first fuse element may be connected between the battery module and the pack terminals.

In the battery protection circuit, the first fuse element may be connected between two adjacent cells of the cells.

In the battery protection circuit, the first integrated circuit may include a plurality of second input terminals that are electrically connected at opposite ends of each of the cells, detect an over-voltage state of the battery module based on a voltage applied to the second input terminals, and control a voltage applied to the control terminal of the first fuse element depending on a detected result of the over-voltage state.

The battery protection circuit may include a second fuse element located on a current path between the battery module and the pack terminals to block a current flow between the battery module and the pack terminals depending on a voltage applied to a control terminal thereof, and may further include a second integrated circuit configured to include a plurality of input terminals that are electrically connected at opposite ends of each of the cells, to detect an over-voltage state of the battery module based on a voltage applied to the input terminals, and to control a voltage applied to the control terminal of the first fuse element depending on a detected result of the over-voltage state.

The battery protection circuit may further include: a charging control switch located on a current path between the battery module and the pack terminals to control a charging current flow between the battery module and the pack terminals; a discharging control switch disposed on a current path between the battery module and the pack terminals to control a discharging current flow between the battery module and the pack terminals; and a battery controller configured to control switching of the charging control switch and the discharging control switch based on a cell voltage of each of the cells or a current flowing between the battery module and the pack terminals.

In the battery protection circuit, the first integrated circuit and the battery controller may operate independently.

According to one or more exemplary embodiments of the present invention, a battery pack includes: a battery module including a plurality of cells; and a battery protection circuit, wherein the battery protection circuit includes: a plurality of pack terminals configured to connect the battery module to an external device; a first fuse element located on a current path between the battery module and the pack terminals to block a current flow between the battery module and the pack terminals depending on a voltage applied to a control terminal thereof; a first integrated circuit configured to include a first input terminal and control a voltage outputted to the control terminal of the first fuse element depending on a voltage applied to the first input terminal; and a plurality of thermistors connected in series between a positive electrode of the battery module and a first input terminal of the first integrated circuit and having resistance that is varied depending on a temperature of a corresponding cell among the plurality of cells.

The battery pack may further include a printed circuit board including the battery protection circuit mounted thereon and a plurality of conductive tabs coupled to a positive or negative electrode of each of the cells, and the thermistors may be mounted on the printed circuit board as a chip type.

In the battery pack, the thermistors may correspond to the cells, respectively, and each of the thermistors may be located adjacent to a conductive tab that is coupled to a corresponding one of the conductive tabs.

The battery pack may further include an adhesive member to cover together electrode terminals, conductive tabs, and thermistors, which face each other among electrode terminals of the cells, the conductive tabs, and the thermistors.

In the battery pack, each of the thermistors may be a positive temperature coefficient thermistor.

The battery pack may include a second fuse element located on a current path between the battery module and the pack terminals to block a current flow between the battery module and the pack terminals depending on a voltage applied to a control terminal thereof, and may further include a second integrated circuit configured to include a plurality of input terminals that are electrically connected at opposite ends of each of the cells, to detect an over-voltage state of the battery module based on a voltage applied to the input terminals, and to control a voltage applied to the control terminal of the first fuse element depending on a detected result of the over-voltage state.

In the battery pack, the first integrated circuit may include a plurality of second input terminals that are electrically connected at opposite ends of each of the cells, detect an over-voltage state of the battery module based on a voltage applied to the second input terminals, and control a voltage applied to the control terminal of the first fuse element depending on a detected result of the over-voltage state.

The battery pack may include: a charging control switch located on a current path between the battery module and the pack terminals to control a charging current flow between the battery module and the pack terminals; a discharging control switch located on a current path between the battery module and the pack terminals to control a discharging current flow between the battery module and the pack terminals; and a battery controller configured to control switching of the charging control switch and the discharging control switch based on a cell voltage of each of the cells or a current flowing between the battery module and the pack terminals.

DESCRIPTION OF SYMBOLS

Figure 1:
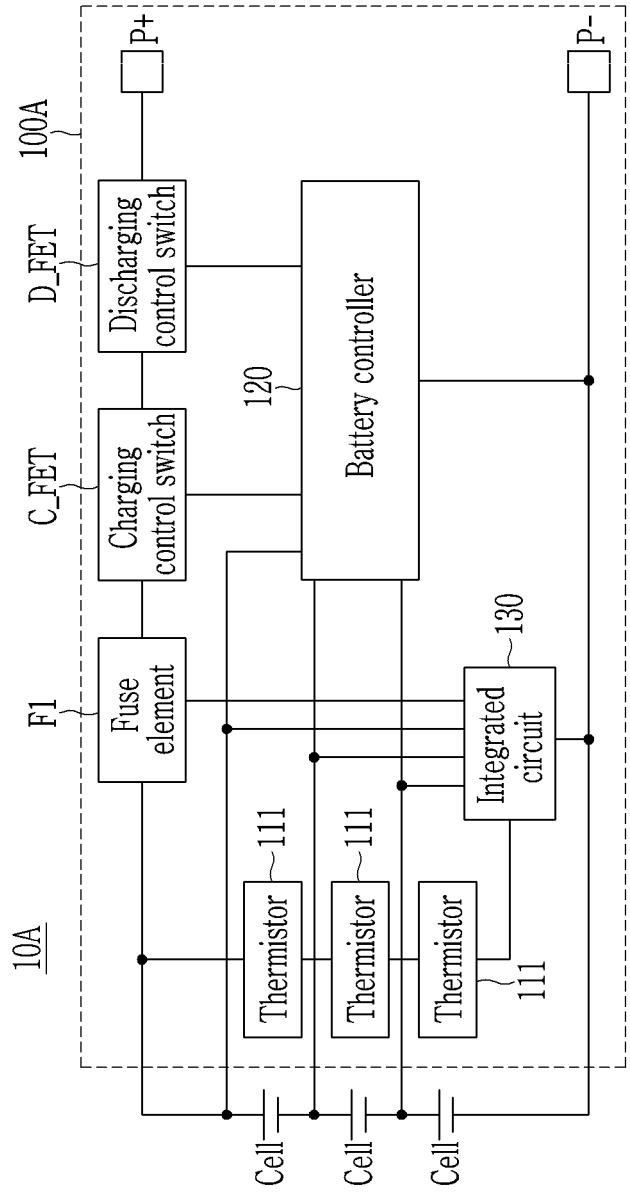
FIG. 1 schematically illustrates a battery pack according to an exemplary embodiment of the present invention.

10A, 10B: battery pack
100A, 100B: battery protection circuit
111: thermistor
120: controller
130, 131, 132: integrated circuit
F1, F2: fuse element
C_FET: charging control switch
D_FET: discharging control switch
P+, P−: pack terminal

DETAILED DESCRIPTION

The present invention will be described more fully herein with reference to the accompanying drawings, in which some exemplary embodiments of the invention are shown. As those skilled in the art would realize, the described embodiments may be modified in various different ways, all without departing from the spirit or scope of the present invention.

To clearly describe the exemplary embodiments, parts that are irrelevant to the description may be omitted, and like numerals refer to like or similar constituent elements throughout the specification. Therefore, the reference numbers of the constituent elements used in a previous drawing may be used in a next drawing.

Further, since sizes and thicknesses of constituent members shown in the accompanying drawings may be arbitrarily given for better understanding and ease of description, the exemplary embodiments are not limited to the illustrated sizes and thicknesses. In the drawings, the thickness of layers, films, panels, regions, etc., may be exaggerated for clarity.

A case of electrically connecting two constituent elements includes not only a case of directly connecting the constituent elements but also a case of connecting the constituent elements via another constituent element therebetween. The constituent element therebetween may include a switch, a resistor, a capacitor, and the like. In describing exemplary embodiments, an expression of connection indicates electrical connection unless explicitly described to be direct connection.

It is to be understood that, although the terms "first," "second," etc. may be used herein to describe various elements, components, regions, layers, and/or sections, these elements, components, regions, layers, and/or sections should not be limited by these terms. These terms are used to distinguish one element, component, region, layer, or section from another element, component, region, layer, or section. Thus, a first element, component, region, layer, or section discussed below could be termed a second element, component, region, layer, or section without departing from the teachings of example embodiments.

Spatially relative terms, such as "beneath," "below," "lower," "above," "upper," and the like, may be used herein for ease of description to describe one element or feature's relationship to another element(s) or feature(s) as illustrated in the figures. It is to be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments and is not intended to be limiting of example embodiments. As used herein, the singular forms "a," "an," and "the" are intended to include the plural forms as well, unless the context clearly indicates otherwise. It is to be further understood that the terms "comprises," "comprising," "includes," and/or "including," if used herein, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which example embodiments of the inventive concept belong. It is to be further understood that terms, such as those defined in commonly-used dictionaries, should be interpreted as having a meaning that is consistent with their meaning in the context of the relevant art and will not be interpreted in an idealized or overly formal sense unless expressly so defined herein.

Herein, a battery protective circuit and a battery pack including the same according to some exemplary embodiments will be described with reference to the drawings.

FIG. 1 schematically illustrates a battery pack according to an exemplary embodiment of the present invention.

Referring to FIG. 1, a battery pack 10A according to the present exemplary embodiment may include a battery module and a battery protection circuit 100A. Constituent elements are illustrated in FIG. 1 according to an exemplary embodiment, and the battery pack 10A according to embodiments of the present invention may be implemented to include more or fewer components.

The battery module may include a plurality of cells connected in series with each other. Although a case in which the battery module includes three cells is illustrated in FIG. 1 as an example for convenience of description, the present invention is not limited thereto. According to another exemplary embodiment, the battery module may be configured to include fewer or more than three cells connected in series.

According to an embodiment, the battery protection circuit 100A includes a plurality of pack terminals P+ and P−, a charging control switch C_FET, a discharging control switch D_FET, a fuse element F1, a plurality of thermistors 111, a battery controller 120, and an integrated circuit (IC) 130.

The pack terminals P+ and P− may be electrically connected to external devices (e.g., charging devices, loads, etc.) to supply electrical energy of the battery module to the external devices or to receive electrical energy from the external devices. That is, the pack terminals P+ and P− may supply the electrical energy of the battery module to the load or receive electrical energy from an external charging device.

The charging control switch C_FET is coupled in series to a charging path of the battery module, and may cut off or supply a charging current of the battery module. The charging path is a current flow path between the battery module and a charging device (not shown) connected through the pack terminals P+ and P− of the battery pack 10A, and serves to transfer a charging current supplied from the charging device to the battery module.

The discharging control switch D_FET is coupled in series to a discharge path of the battery module, and may cut off or supply a discharge current of the battery module. The discharge path is a current flow path between the battery module and a load (not shown) connected through the pack terminals P+ and P− of the battery pack 10A, and serves to transfer a discharging current supplied from the battery module to the load.

The charging path and the discharging path are relatively large in magnitude of the current flowing through the path compared to other current paths in the battery pack 10A. In this specification, the discharging path and the charging path are sometimes referred to as "high current paths."

In an embodiment, the charging control switch C_FET and the discharging control switch D_FET may each include a field effect transistor (FET). For example, each of the charging control switch C_FET and the discharging control switch D_FET may include an N-channel FET.

Although a case in which the charging control switch C_FET and the discharging control switch D_FET are connected between a positive electrode of the battery module and the positive pack terminal P+ of the battery pack 10A is illustrated in FIG. 1 as an example, the present invention is not limited thereto. According to another exemplary embodiment, the charging control switch C_FET or the discharging control switch D_FET may be connected between a negative electrode of the battery module and the negative electrode pack terminal P− of the battery pack 10A.

The fuse element F1 may be connected in series to a high current path, i.e., between one of electrode terminals of the battery module and a pack terminal corresponding thereto (e.g., between a positive electrode of the battery module and the positive pack terminal P+), to block a current flow between the battery module and an external device.

In an embodiment, the fuse element F1 may be a self-control protection (SCP) element including a control terminal to which a control voltage is externally applied, at least one fuse, and heating resistors. In this case, the heating resistor included in the fuse element F1 may generate heat depending on a voltage applied to the control terminal of the fuse element F1, and the fuses may be disconnected by the heat of the heating resistors to block the high current path of the battery module. The control terminal of the fuse element F1 may be connected to an output terminal of the integrated circuit 130, and may receive a control voltage for controlling the heat generation of the heating resistors constituting the fuse element F1 from the output terminal of the integrated circuit 130.

The plurality of thermistors 111 may be connected in series between the positive electrode of the battery module and an input terminal of the integrated circuit 130. In an embodiment, the plurality of thermistors 111 are disposed to correspond one-to-one to each cell constituting the battery module, and can be thermally coupled to corresponding cells.

The thermistors 111 are elements having resistance that is varied depending on temperature. Accordingly, resistance of the thermistors 111 thermally coupled to the respective cells varies depending on temperatures of the corresponding cells. As a result, a voltage that drops by the thermistors 111 and then is inputted into the input terminal of the integrated circuit 130 (herein referred to as a "temperature sensing voltage") may vary depending on the cell temperature of the battery module.

In an embodiment, each of the thermistors 111 may be a positive temperature coefficient (PTC) thermistor having resistance that increases when the temperature increases. In this case, as the temperature of each cell increases, the resistance value of the corresponding thermistor increases and the temperature sensing voltage applied to the input terminal of the integrated circuit 130 decreases.

In an embodiment, each of the thermistors 111 may be a negative temperature coefficient (NTC) thermistor having resistance that increases when the temperature decreases. In this case, as the temperature of each cell increases, the resistance value of the corresponding thermistor decreases and the temperature sensing voltage applied to the input terminal of the integrated circuit 130 increases.

The battery controller 120 may control a general operation of the battery protection circuit 100A.

The battery controller 120 may be electrically connected to opposite ends of each cell constituting the battery module or opposite ends of the battery module, and may detect the voltage of each cell constituting the battery module or the voltage of the battery module.

The battery controller 120 may measure a magnitude of the current flowing through the high current path.

The battery controller 120 may control on and off of the charging control switch C_FET or the discharging control switch D_FET based on the cell voltage of each cell, the module voltage of the battery module, a magnitude of the current flowing through the high current path, and the like. For example, the battery controller 120 may detect an overvoltage state of the battery module by comparing the cell voltage of each cell with a reference voltage for determining overvoltage, and may turn off the charging control switch C_FET or may turn off the charging control switch C_FET and the discharging control switch D_FET when the battery module is in the overvoltage state. In addition, for example, the battery controller 120 may detect an overcurrent (overcharge current or over-discharge current) state of the battery module based on a magnitude of the current flowing through the high current path, and may turn off the charging control switch C_FET or may turn off the charging control switch C_FET and the discharging control switch D_FET when the battery module is in the overcurrent state.

Each function of the battery controller 120 may be performed by a processor implemented as at least one central processing unit (CPU) or another chipset, a microcontroller unit (MCU), a microprocessor, or the like.

The integrated circuit 130 may be electrically connected to opposite ends of each cell constituting the battery module through voltage detection input terminals, to detect the cell voltage of each cell. The integrated circuit 130 may detect the overvoltage state of each cell based on the cell voltage of each cell, and may block the high current path by controlling the fuse element F1 when at least one cell is in the overvoltage state.

The integrated circuit 130 may be connected to the thermistors 111 connected in series to each other through a temperature-detecting input terminal to detect a temperature sensing voltage through the thermistors 111. The integrated circuit 130 may detect an over-temperature state by comparing the temperature sensing voltage with a reference voltage when the temperature sensing voltage is inputted through the thermistors 111, and may block the high current path by controlling the fuse element F1 when the temperature sensing voltage is detected. Herein, a fixed value may be used as the reference voltage to be compared with the temperature sensing voltage, or the reference voltage may be varied depending on the cell voltage of the battery module.

According to the present exemplary embodiment, although a case in which the over-temperature and the over-voltage are detected by one integrated circuit 130 in the battery pack 10A has been described as an example, the present invention is not limited thereto.

Figure 2:
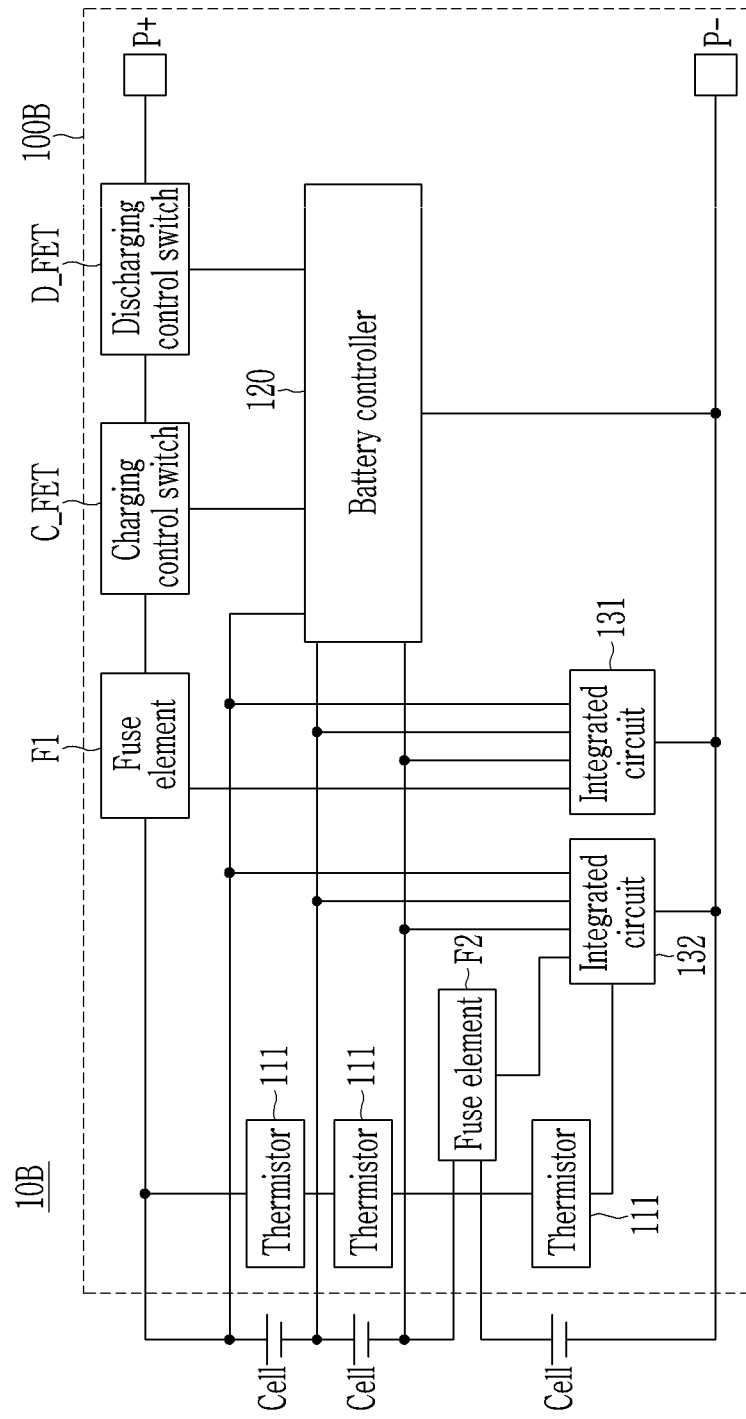
FIG. 2 schematically illustrates a battery pack according to another exemplary embodiment of the present invention.

FIG. 2 schematically illustrates a battery pack according to another exemplary embodiment of the present invention, wherein the battery pack further includes an integrated circuit and a fuse element for temperature detection using thermistors.

Referring to FIG. 2, according to an embodiment of the present invention, the battery pack 10B may include a plurality of integrated circuits 131 and 132 for detecting the state (voltage, temperature, etc.) of the battery module and thus for a safety operation.

Among the integrated circuits, the integrated circuit 131 may detect the cell voltage of each cell constituting the battery module through voltage detection input terminals, and may detect the overvoltage state of each cell based on the detected cell voltage. When at least one cell is in the overvoltage state, the high current path may be blocked by controlling the fuse element F1.

Among the integrated circuits, the integrated circuit 132 may be connected to the thermistors 111 connected in series to each other through a temperature-detecting input terminal to receive a temperature sensing voltage through the thermistors 111. Then, an over-temperature state of the cells may be detected by comparing the inputted temperature sensing voltage with the reference voltage, and when the over-temperature state is detected, a fuse element F2 may be controlled to block the high current path.

In an embodiment, the fuse elements F1 and F2 may be disposed at different portions for improved stability. As illustrated in FIG. 1, as an example, the fuse element F1 is disposed between the positive electrode of the battery module and the positive pack terminal P+, and the fuse element F2 may be disposed between two neighboring cells among the cells constituting the battery module.

In an embodiment, each of the fuse elements F1 and F2 may be a self-control protection (SCP) element including a control terminal to which a control voltage is externally applied, at least one fuse, and heating resistors. In this case, the heating resistor included in each of the fuse elements F1 and F2 may generate heat depending on a voltage applied to the control terminal of the fuse element F1 or F2, and the fuses may be disconnected by the heat of the heating resistors to block the high current path of the battery module. In addition, control terminals of the fuse elements F1 and F2 may be respectively connected to output terminals of the corresponding integrated circuit 131 and 132 to receive control voltages for controlling heat generation of the heating resistors included in the fuse elements F1 and F2 from output terminals of the corresponding integrated circuits 131 and 132.

In the exemplary embodiments described above, the battery controller 120 and the integrated circuits 130, 131, and 132 may assist each other in protecting each other. Even when one of the battery controller 120 and the integrated circuits 130, 131, and 132 malfunctions to disable a battery protection function from being properly performed, the others may serve to perform the battery protection function to secure the safety of the battery packs 10A and 10B. To this end, the battery controller 120 and the integrated circuits 130, 131, and 132 may be driven independently of each other.

In the above embodiments, the temperature sensing voltage inputted through the thermistors 111 is compared with the reference voltage, and the integrated circuits 130, 131, and 132 may be used to improve the accuracy and safety of the control compared with the use of a transistor such as a FET. In the above exemplary embodiments, the integrated circuits 130, 131, and 132 may clearly distinguish between a high level voltage and a low level voltage depending on the resistance of the thermistors 111, and, thus, the fuse element may be accurately disconnected in a situation in which the fuse element needs to be disconnected, thereby ensuring control accuracy and stability of the fuse element.

In contrast, when a transistor such as a FET is used as a control switch and a thermistor is connected to a control terminal of the control switch as a voltage-distributing resistor, a small voltage may be applied to the control terminal of the control switch such that a small current flows in the fuse element. In this case, the inside of the fuse element may be slowly melted and deformed, which may affect a characteristic of the fuse element, and, thus, the control accuracy of the fuse element may deteriorate.

The battery protection circuits 100A and 100B according to the above-described exemplary embodiments may be mounted on a printed circuit board (PCB) and combined with the battery module.

Figure 3:
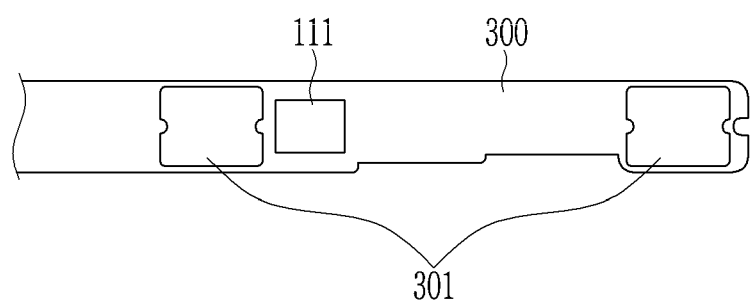
FIG. 3 schematically illustrates an example of a PCB on which a battery protection circuit is mounted according to an exemplary embodiment of the present invention.

FIG. 3 schematically illustrates an example of a PCB 300 on which the battery protection circuits 100A and 100B may be mounted according to exemplary embodiments of the present invention, and some constituent elements (e.g., the battery controller 120 and the like) of the battery protection circuits 100A and 100B are not shown.

Referring to FIG. 3, the PCB 300 may include a plurality of conductive tabs 301, and each of the conductive tabs 301 may be coupled to a positive or negative electrode of a corresponding cell. For example, each conductive tab 301 may be coupled to the positive or negative electrode of the corresponding cell. In an embodiment, for example, each of the conductive tabs 301 may be coupled to the positive or negative electrode of the corresponding cell using an adhesive member (e.g., silicone, adhesive tape, etc.). In the latter case, the adhesive members may be coated or attached to cover not only the terminals of the respective cells but also the corresponding conductive tabs 301 and thermistors 111 to effectively transmit the heat of each cell to the corresponding thermistor 111.

According to an exemplary embodiments of the present invention, a chip type of thermistor 111 may be mounted on the PCB 300.

In exemplary embodiments, each of the thermistors 111 is disposed at a position where the heat of each cell is effectively transferred in order to react sensitively to the temperature change of the corresponding cell. For example, as illustrated in FIG. 3, each of the thermistors 111 may be disposed adjacent to a conductive tab 301 that is coupled to a positive or negative electrode of the corresponding cell. In addition, for example, each of the thermistors 111 may be disposed on one of opposite surfaces of the PCB 300 which face the respective cells.

Referring to FIG. 3, the chip type of thermistor 111 may be mounted on a PCB 300, unlike a TCO, such that it is not necessary to separately attach the thermistors 111 to each cell. Therefore, the assembling complexity of the battery packs 10A and 10B may be reduced as compared with a conventional battery pack using a TCO for the safety operation of the battery module, thereby lowering the unit cost.

While some exemplary embodiments of the present invention have been particularly shown and described with reference to the accompanying drawings, the specific terms used herein are used for the purpose of describing the invention and are not intended to be limiting of the scope of the invention set forth in the claims. Therefore, those skilled in the art will understand that various modifications and other equivalent embodiments of the present invention are to be included within the technical spirit of the appended claims.

What is claimed is:

1. A battery protection circuit comprising:
   a plurality of pack terminals configured to connect a battery module to an external device;
   a first fuse element located on a current path between the battery module and the plurality of pack terminals to block a current flow between the battery module and the plurality of pack terminals depending on a voltage applied to a control terminal of the first fuse element;
   a first integrated circuit configured to include a first input terminal and configured to control a voltage outputted to the control terminal of the first fuse element depending on a voltage applied to the first input terminal; and
   a plurality of thermistors connected in series between a positive electrode of the battery module and the first input terminal of the first integrated circuit and each thermistor of the plurality of thermistors having a resistance that is varied depending on a temperature of a corresponding cell among a plurality of cells constituting the battery module.

2. The battery protection circuit of claim 1, wherein the plurality of thermistors correspond to the plurality of cells, respectively, and each thermistor of the plurality of thermistors is located adjacent to a corresponding cell of the plurality of cells.

3. The battery protection circuit of claim 1, wherein each thermistor of the plurality of thermistors is a positive temperature coefficient thermistor.

4. The battery protection circuit of claim 1, wherein each thermistor of the plurality of thermistors comprises a chip mounted on a printed circuit board.

5. The battery protection circuit of claim 1, wherein the first fuse element is connected between the battery module and the plurality of pack terminals.

6. The battery protection circuit of claim 1, wherein the first fuse element is connected between two adjacent cells of the plurality of cells.

7. The battery protection circuit of claim 1, wherein the first integrated circuit comprises a plurality of second input terminals that are electrically connected at opposite ends of each cell of the plurality of cells to detect an over-voltage state of the battery module based on a voltage applied to the plurality of second input terminals to control a voltage applied to the control terminal of the first fuse element depending on a detected result of the over-voltage state.

8. The battery protection circuit of claim 1, further comprising:
   a second fuse element located on a current path between the battery module and the plurality of pack terminals to block a current flow between the battery module and the plurality of pack terminals depending on a voltage applied to a control terminal of the second fuse element; and
   a second integrated circuit configured to include a plurality of input terminals that are electrically connected at opposite ends of each cell of the plurality of cells to detect an over-voltage state of the battery module based on a voltage applied to the plurality of input terminals, and to control a voltage applied to the control terminal of the second fuse element depending on a detected result of the over-voltage state.

9. The battery protection circuit of claim 1, further comprising:
a charging control switch located on a current path between the battery module and the plurality of pack terminals to control a charging current flow between the battery module and the plurality of pack terminals;
a discharging control switch located on a current path between the battery module and the plurality of pack terminals to control a discharging current flow between the battery module and the plurality of pack terminals; and
a battery controller configured to control switching of the charging control switch and the discharging control switch based on a cell voltage of each cell of the plurality of cells or a current flowing between the battery module and the plurality of pack terminals.

10. The battery protection circuit of claim 9, wherein the first integrated circuit and the battery controller operate independently.

11. A battery pack comprising:
a battery module comprising a plurality of cells; and
a battery protection circuit,
wherein the battery protection circuit comprises:
a plurality of pack terminals configured to connect the battery module to an external device;
a first fuse element located on a current path between the battery module and the plurality of pack terminals to block a current flow between the battery module and the plurality of pack terminals depending on a voltage applied to a control terminal thereof;
a first integrated circuit configured to include a first input terminal and configured to control a voltage outputted to the control terminal of the first fuse element depending on a voltage applied to the first input terminal; and
a plurality of thermistors connected in series between a positive electrode of the battery module and the first input terminal of the first integrated circuit and each thermistor of the plurality of thermistors having a resistance that is varied depending on a temperature of a corresponding cell among the plurality of cells.

12. The battery pack of claim 11, further comprising a printed circuit board comprising the battery protection circuit mounted thereon and a plurality of conductive tabs coupled to a positive electrode or a negative electrode of each cell of the plurality of cells,
wherein the plurality of thermistors are mounted on the printed circuit board as a chip type.

13. The battery pack of claim 12, wherein the plurality of thermistors correspond to the plurality of cells, respectively, and each thermistor of the plurality of thermistors is located adjacent to a conductive tab, that is coupled to a corresponding cell of the plurality of cells, among the plurality of conductive tabs.

14. The battery pack of claim 13, further comprising an adhesive member to cover together electrode terminals, conductive tabs, and thermistors, which face each other among electrode terminals of the plurality of cells, the plurality of conductive tabs, and the plurality of thermistors.

15. The battery pack of claim 12, wherein each thermistor of the plurality of thermistors is a positive temperature coefficient thermistor.

16. The battery pack of claim 11, further comprising:
a second fuse element located on a current path between the battery module and the plurality of pack terminals to block a current flow between the battery module and the plurality of pack terminals depending on a voltage applied to a control terminal thereof; and
a second integrated circuit configured to include a plurality of input terminals that are electrically connected at opposite ends of each cell of the plurality of cells to detect an over-voltage state of the battery module based on a voltage applied to the plurality of input terminals, and to control a voltage applied to the control terminal of the first fuse element depending on a detected result of the over-voltage state.

17. The battery pack of claim 11, wherein the first integrated circuit comprises a plurality of second input terminals that are electrically connected at opposite ends of each cell of the plurality of cells to detect an over-voltage state of the battery module based on a voltage applied to the plurality of second input terminals to control a voltage applied to the control terminal of the first fuse element depending on a detected result of the over-voltage state.

18. The battery pack of claim 11, further comprising:
a charging control switch located on a current path between the battery module and the plurality of pack terminals to control a charging current flow between the battery module and the plurality of pack terminals;
a discharging control switch located on a current path between the battery module and the plurality of pack terminals to control a discharging current flow between the battery module and the plurality of pack terminals; and
a battery controller configured to control switching of the charging control switch and the discharging control switch based on a cell voltage of each cell of the plurality of cells or a current flowing between the battery module and the plurality of pack terminals.

* * * * *